(12) United States Patent
McPhee

(10) Patent No.: US 7,394,658 B2
(45) Date of Patent: Jul. 1, 2008

(54) HEAT SINK WITH TWIST LOCK MOUNTING MECHANISM

(75) Inventor: Philip S. McPhee, Granger, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 197 days.

(21) Appl. No.: 11/218,146

(22) Filed: Sep. 1, 2005

(65) Prior Publication Data

US 2007/0047207 A1    Mar. 1, 2007

(51) Int. Cl.
*H05K 7/20* (2006.01)
*H01L 23/34* (2006.01)
*F28F 7/00* (2006.01)

(52) U.S. Cl. .............. 361/710; 361/704; 361/707; 361/709; 165/80.2; 257/718; 257/719; 257/726; 257/727

(58) Field of Classification Search ......... 361/704–721; 174/16.3; 165/80.2, 80.3, 185; 257/706, 257/707, 712, 713, 718, 719, 726, 727
See application file for complete search history.

(56) References Cited

U.S. PATENT DOCUMENTS

| | | | | |
|---|---|---|---|---|
| 3,004,196 A * | 10/1961 | Drexel | ............ | 257/717 |
| 3,391,242 A * | 7/1968 | Sudges | ............ | 174/16.3 |
| 4,376,560 A * | 3/1983 | Olsson et al. | ............ | 439/331 |
| 4,444,309 A * | 4/1984 | Morton, Jr. | ............ | 206/724 |
| 4,446,504 A * | 5/1984 | Jordan et al. | ............ | 361/715 |
| 4,597,617 A * | 7/1986 | Enochs | ............ | 439/66 |
| 4,631,819 A | 12/1986 | Lasier et al. | ............ | 29/840 |
| 4,683,423 A * | 7/1987 | Morton | ............ | 324/755 |
| 4,695,924 A | 9/1987 | Wozniczka | ............ | 361/386 |
| 4,707,726 A | 11/1987 | Tinder | ............ | 357/81 |
| 4,964,198 A | 10/1990 | McCarthy | ............ | 24/458 |
| 5,099,550 A | 3/1992 | Beane et al. | ............ | 24/555 |
| 5,109,318 A | 4/1992 | Funari et al. | ............ | 361/388 |
| 5,201,866 A | 4/1993 | Mok | ............ | 165/80.3 |
| 5,368,094 A | 11/1994 | Hung | ............ | 165/80.3 |
| 5,369,879 A | 12/1994 | Goeschel et al. | ............ | 29/837 |
| 5,377,078 A | 12/1994 | Kalis | ............ | 361/707 |
| 5,437,561 A | 8/1995 | Earl et al. | ............ | 439/567 |
| 5,587,608 A * | 12/1996 | Meng | ............ | 257/712 |
| 5,640,304 A | 6/1997 | Hellinga et al. | ............ | 361/707 |
| 5,766,022 A * | 6/1998 | Chapin et al. | ............ | 439/73 |
| 6,177,727 B1 | 1/2001 | Hart, Jr. et al. | ............ | 257/727 |
| 6,304,449 B1 | 10/2001 | Zhang | ............ | 361/704 |
| 6,350,952 B1 | 2/2002 | Gaku et al. | ............ | 174/52.2 |
| 6,452,261 B1 * | 9/2002 | Kodama et al. | ............ | 257/688 |
| 6,535,389 B2 | 3/2003 | Rodriguez et al. | ............ | 361/719 |
| 6,587,344 B1 | 7/2003 | Ross | ............ | 361/704 |
| 6,707,676 B1 | 3/2004 | Geva et al. | ............ | 361/719 |
| 6,845,664 B1 * | 1/2005 | Okojie | ............ | 73/431 |
| 7,170,751 B2 * | 1/2007 | Mayer | ............ | 361/719 |
| 2005/0022970 A1 * | 2/2005 | Mania et al. | ............ | 165/80.3 |

* cited by examiner

*Primary Examiner*—Lisa Lea-Edmonds
*Assistant Examiner*—Anthony M Haughton
(74) *Attorney, Agent, or Firm*—Brinks Hofer Gilson & Lione

(57) ABSTRACT

A heat sink with a twist lock mounting mechanism. An electronic device may be mounted to the heat sink without the use of external fasteners, such as screws or rivets. Instead of using external fasteners, the heat sink includes resilient mounting flanges for securing an electronic device. Rotating an electronic device on the heat sink secures the electronic device in a friction fit with the resilient mounting flanges. Multiple electronic devices may be mounted to the heat sink, either manually or through an automated process.

39 Claims, 8 Drawing Sheets

HEAT SINK WITH TWIST LOCK MOUNTING MECHANISM

BACKGROUND OF THE INVENTION

1. Technical Field

The present invention relates to heat sinks. More particularly, the invention relates to heat sinks with mechanisms for mounting an electronic device.

2. Related Art

Electronic devices generate heat during operation. If the heat is not properly dissipated, the electronic device may, over time, malfunction or fail. The thermal energy generated by an electronic device may also affect the operation of nearby components, particularly given the confined spaces in which many electronic devices are installed. Thus, proper thermal management can have a significant impact on the reliability and longevity of electronic devices.

The use of a heat sink is a common technique for dissipating heat generated by an electronic device. The heat sink may be placed in thermal contact with an electronic device, and typically includes fins that extend from the body of the heat sink. The fins give the heat sink a larger surface area so that a greater amount of thermal energy dissipates from the electronic device into the surrounding environment. Heat sinks are typically fabricated from materials with high thermal conductivity to efficiently transfer thermal energy from the electronic device. However, mounting an electronic device to a heat sink can be a difficult proposition.

Electronic devices are commonly mounted to heat sinks using screws or rivets. Such methods of mounting a heat sink suffer from several disadvantages. For example, valuable space above the electronic device is generally left open to provide tool clearance in case the electronic device needs to be repaired or removed. Since screw mounting is difficult to automate, mounting the electronic device can be a time consuming and costly process. Mounting costs are also increased due to component costs, not only for the screws or rivets themselves, but also for the components typically associated with such fasteners, such as nuts and washers.

Moreover, the use of screws or rivets to mount an electronic device often degrades thermal performance. If the electronic device is of the TO-3 package type, for example, a pair of mounting tabs extend from the body of the electronic device. To mount such an electronic device, one tab is fastened to the heat sink and then the other tab is secured. Attachment of the first tab to the heat sink, however, typically deforms the tab such that a portion of the electronic device is raised above the heat sink. This is also exacerbated by the bowed base typical of TO-3 packages. Even after the second tab is fastened, the deformation of the first tab may increase thermal resistance between the heat sink and the electronic device. Screws may also be subject to loosening due to vibration, which also increases thermal resistance.

Another technique for mounting an electronic device to a heat sink is the use of spring clips. For example, Ross (U.S. Pat. No. 6,587,344), Hellinga et al. (U.S. Pat. No. 5,640,304) and Meng (U.S. Pat. No. 5,587,608) each disclose the use of spring clips for clamping an electronic device to a heat sink. These designs may work well with electronic devices having a single mounting point, such as TO-220 type packaging. However, these designs are not suitable for electronic devices with two or more mounting tabs, such as TO-3 type packaging.

Therefore, a need exists for a heat sink that overcomes the aforementioned difficulties.

SUMMARY

This invention provides a heat sink with a twist lock mounting mechanism. An electronic device may be mounted to the heat sink without the use of external fasteners, such as screws or rivets. Instead of using external fasteners, the heat sink includes resilient mounting flanges for securing an electronic device. Rotating an electronic device on the heat sink secures the electronic device in a friction fit with the resilient mounting flanges. Multiple electronic devices may be mounted to the heat sink, either manually or through an automated process.

In some examples, the heat sink may be particularly adapted to secure electronic devices with multiple tabs, such as electronic devices with TO-3 type packaging. The heat sink may include a mounting platform and a pair of resilient mounting flanges extending from the mounting platform. To allow the leads of the electronic devices to pass through the mounting platform, at least one pin opening that is dimensioned to receive the leads of the electronic devices may be defined in the mounting platform. Each of the resilient mounting flanges may have a clamping portion that is spaced apart from the mounting area. By rotating the electronic device on the mounting platform, the tabs of the electronic device may be secured in a frictional fit between the clamping portion of the resilient mounting flanges and the mounting platform.

The invention also provides a method of mounting an electronic device on a heat sink. The lead(s) of an electronic device are aligned with pin opening(s) on the mounting platform of the heat sink. Once aligned with the pin openings, the electronic device may be placed on the mounting platform of the heat sink. By rotating the electronic device on the mounting platform, tabs on the electronic device engage resilient mounting flanges on the heat sink. This engagement between the tabs and resilient mounting flanges deflects the resilient mounting flanges such that the tabs are secured in a frictional fit on the heat sink. The steps for mounting the electronic device may be manually performed or may be automated.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
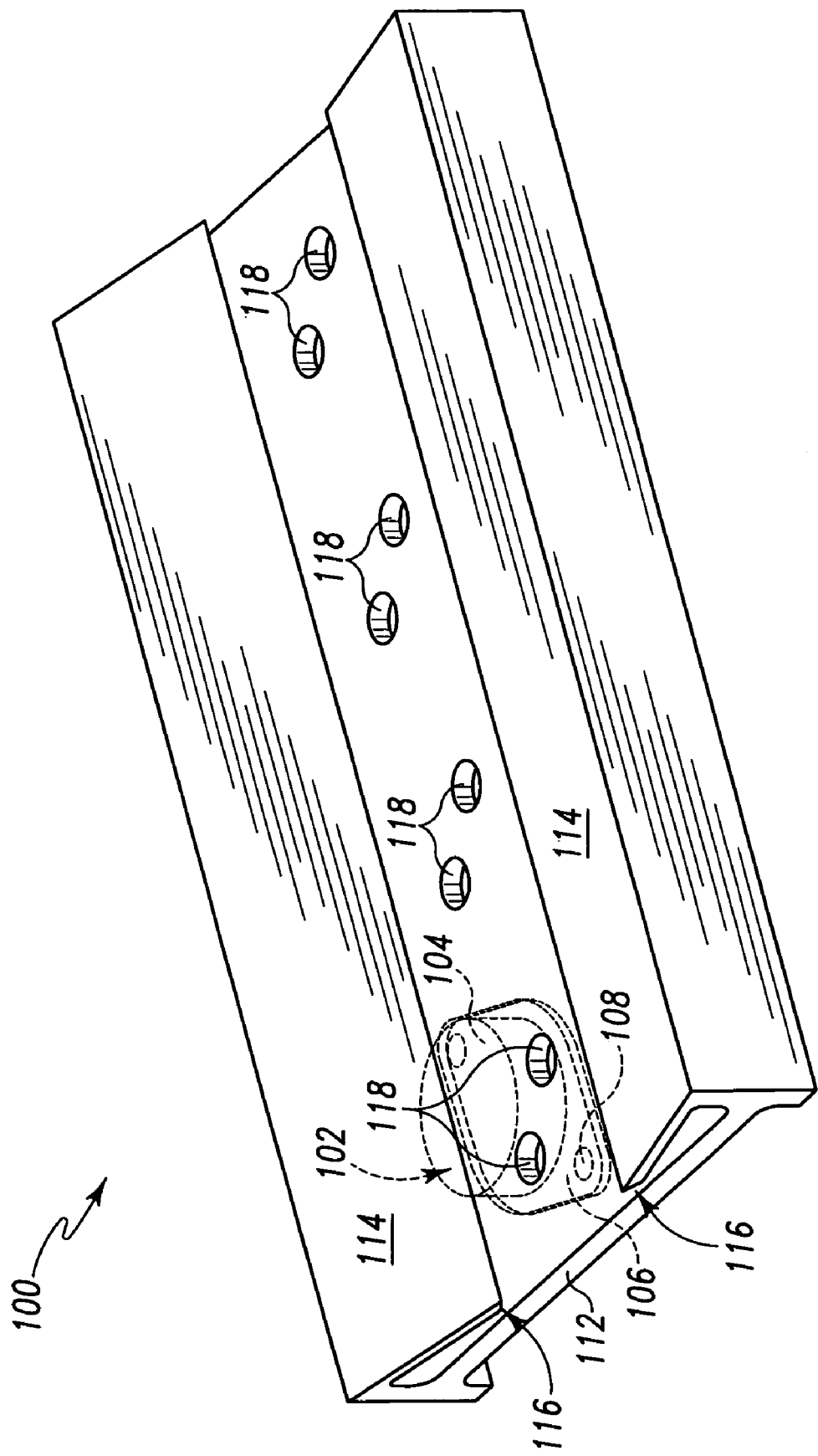
FIG. 1 is a perspective view of an example heat sink with an example electronic device placed on the mounting platform, but not secured by the resilient mounting flanges.
Figure 2:
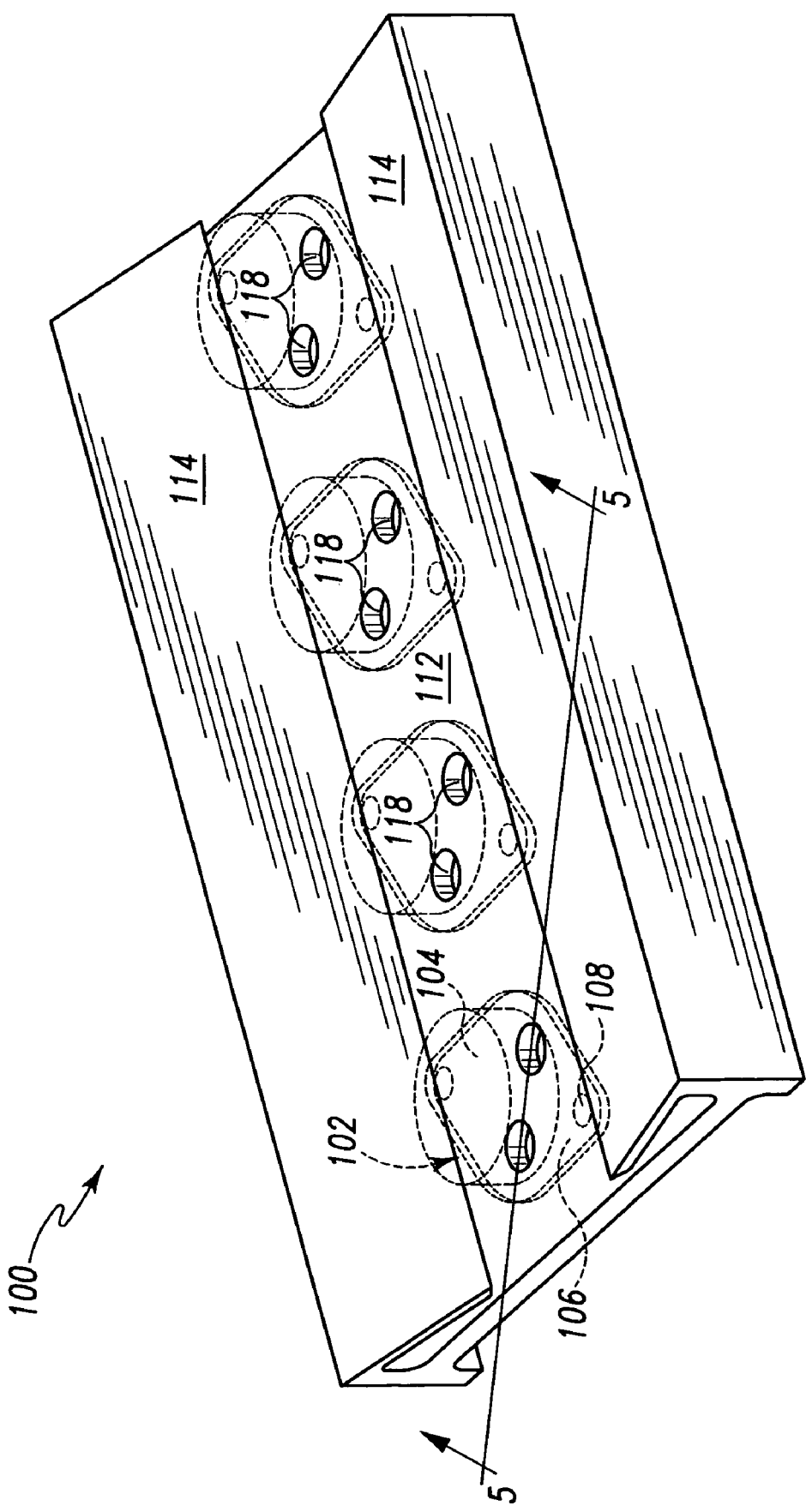
FIG. 2 is the heat sink of FIG. 1, but with multiple electronic devices secured in place.

FIGS. 1 and 2 show an example heat sink 100 for carrying one or more example electronic devices 102. The heat sink 100 may be adapted to hold electronic devices 102 packaged with tabs extending from the body of the electronic device. Such electronic device packages include, but are not limited to TO-3 type packaging.

In the example shown, the electronic device 102 has a can-shaped body 104 with a pair of tabs 106 extending outwardly from the body 104. Often, openings 108 are defined in the tabs 106 for inserting screws, rivets or other external fasteners to secure the electronic device 102 to a mounting surface. However, such external fasteners are not required to secure the electronic device 102 to the present heat sink 100. While the example electronic device 102 has two tabs 106, it should be appreciated that the electronic device 102 may have a single tab or more than two tabs. By the term tab, it is meant any portion of an electronic device that may be secured to the heat sink 100.

The electronic device 102 may also include leads 110 (as most easily seen in FIGS. 5 and 6) to electrically connect the device 102 to a printed circuit board, a power supply, another electronic device or any other component(s). The electronic device 102 is shown with two leads for purposes of example only. It should be appreciated that the electronic device 102 may have a single lead, or more than two leads.

The heat sink 100 comprises a mounting platform 112 and a pair of opposing resilient mounting flanges 114. In the example shown, the resilient mounting flanges 114 extend from the longitudinal sides of the mounting platform 112. Each resilient mounting flange 114 includes a clamping portion 116 suspended above the mounting platform 112 that may secure the tabs 106 of the electronic device 102 to the mounting platform 112. It should be appreciated that the mounting platform 112 and resilient mounting flanges 114 may be constructed as a unitary member of single piece construction or can be separate pieces that are directly connected.

To mount the electronic device 102 on the heat sink 100, the electronic device 102 may be placed on the mounting platform 112 between the resilient mounting flanges 114 and rotated until the tabs 106 of the electronic device 102 deflect the clamping portion 116 of the resilient mounting flanges 114. In this arrangement, the tabs 106 of the electronic device 102 will be secured by a frictional fit between the clamping portion 116 of the resilient mounting flanges 114 and the mounting platform 112.

The mounting platform 112 may contact at least a portion of the base of the electronic device 102 to dissipate heat away from the electronic device 102. In some examples, the base of the electronic device 102 may be in direct contact with the mounting platform 112. In other examples, the mounting platform 112 may not directly contact the electronic device 102, but may be in thermal contact with the electronic device 102. For example, a gap filler (not shown) may be provided between the mounting platform 112 and the base of the electronic device 102 to increase thermal contact. For example, a gap filler sold under the name SIL-PAD™ from The Bergquist Company of Chanhassen, Minn. may be a suitable gap filler to increase thermal contact between the mounting platform 112 and electronic device 102.

The mounting platform 112 may be formed from any thermally conductive material, such as aluminum, copper or steel. In some examples, mounting platform 112 may be formed from the same material as that of the resilient mounting flanges 114. For example heat sink 100 may be extruded entirely from aluminum, copper or steel. In other examples, however, the mounting platform 112 may be formed from one or more materials that are different from the resilient mounting flanges 114. For example, mounting platform 112 may be formed from copper while the resilient mounting flanges 114 may be formed from steel. In examples where the mounting platform 112 and resilient mounting flanges 114 are formed from different materials, the resilient mounting flanges 114 may be attached to the mounting platform 112 using a fastening mechanism, such as a screw or rivot, by welding or by using an adhesive. The heat sink 100 may also include fins (not shown) and/or other structures for dissipating heat away from the electronic device 102.

Pin openings 118 may be defined in the mounting platform 112 to allow the leads 110 of the electronic device 102 to pass through the mounting platform 112. The number of pin openings 118 may correspond to the number of leads 110 in the electronic device 102 to be mounted on the heat sink 100. If the electronic device 102 has two leads, for example, the mounting platform may be provided with two corresponding pin openings. If the electronic device 102 has three leads 110, however, the mounting platform 112 may have three corresponding pin openings 118.

In some examples, the number of pin openings 118 may not correspond to the number of leads 110 in the electronic device 102. For example, the number of pin openings 118 may be less than the number of leads 110 if the pins openings 118 are sized to receive multiple leads 110. For purposes of example only, consider an electronic device 102 with two leads 110. Instead of two pin openings 118 to receive each of the leads 110, the mounting platform 112 may have a single pin opening 118 sized to accommodate both of the leads 110.

In other examples, the number of pin openings 118 may be greater than the number of leads 110 in the electronic device 102. For example, the pin openings 118 may be configured to receive multiple types of electronic devices 102 with a differing number of leads 110. For example, the mounting platform 112 may have an arrangement of pin openings 118 capable of accommodating electronic devices 102 with two, three, four or more leads 110. For purposes of example only, consider an arrangement of pin openings configured to receive a first electronic device with two leads and a second electronic device with three leads. In one example pin opening arrangement, the mounting platform may include three pin openings that accommodate both the first electronic device and the second electronic device. In this example arrangement, two of the pin openings may be arranged to receive both pins of the first electronic device and two pins from the second electronic device. Instead of three pin openings, a suitable pin opening arrangement for this example may include five pin openings. With this arrangement, two pin openings could be configured to receive the two leads from the first electronic device while the other three pin openings could accommodate the leads from the second electronic device.

The pin openings 118 may be dimensioned to allow movement of the leads 110 when the electronic device 102 rotates from an initial position to a secure position. It should be appreciated that the pin openings 118 may have various dimensions and shapes to accommodate movement of the leads 110. For example, the pin openings 118 may be circular in shape with a diameter greater than the expected movement of the leads 110 during rotation of the electronic device 102. By way of another example, the pin openings 118 may be arcuate in shape and dimensioned to allow sufficient movement of the leads 110 during rotation of the electronic device 102. By way of a further example, the pin openings 118 may be a polygon in shape, a channel shape, or any other shape.

In some examples, the pin openings 118 may be electronically insulated. For example, the internal surface of the pin openings 118 may be lined with an electronically insulating material, such as rubber. In other examples, the pin openings 118 may not contain electronically insulative material. In such cases, the heat sink 110 may conduct electricity during operation.

Figure 3:
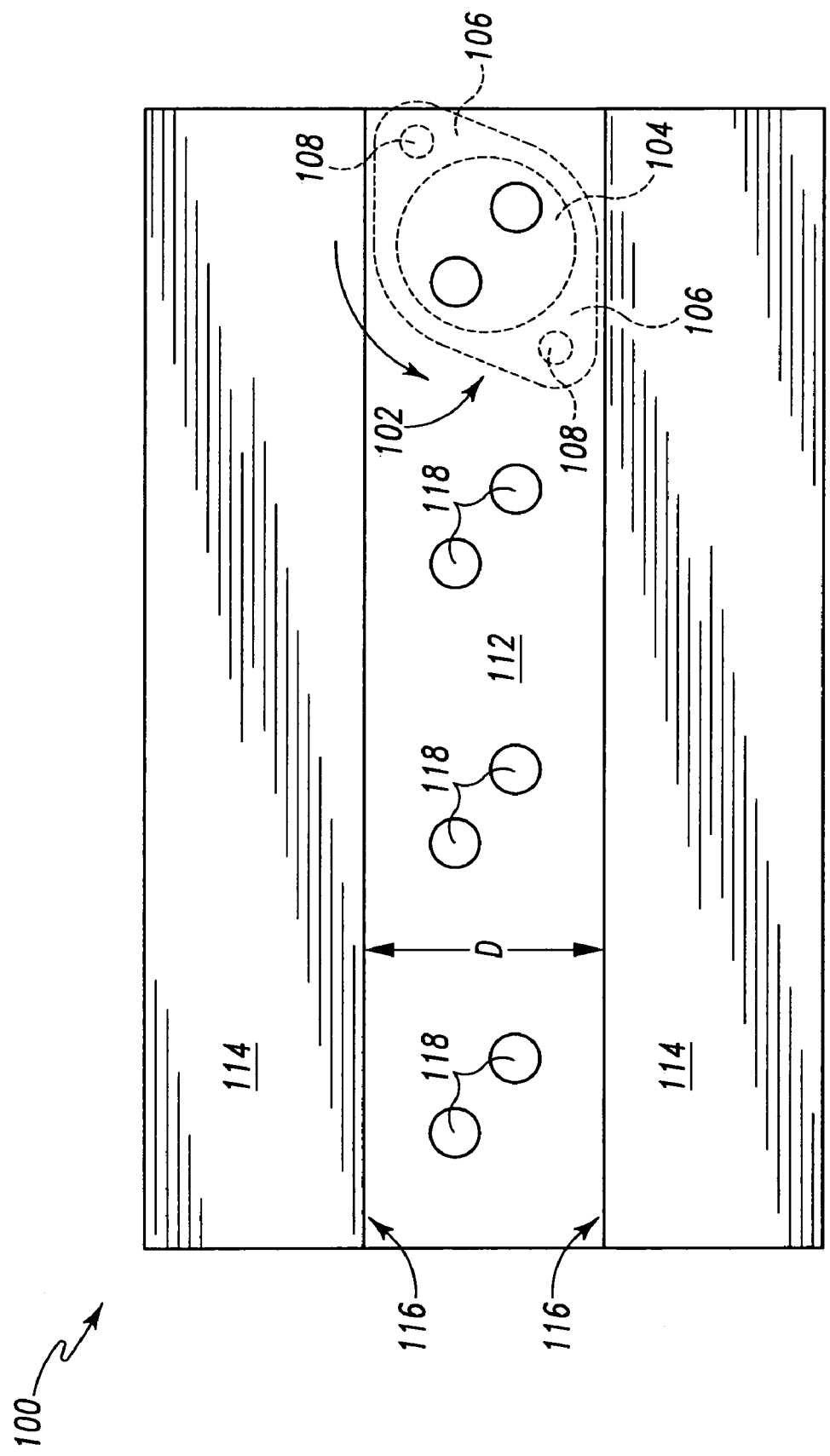
FIG. 3 is a top plan view of the heat sink of FIG. 1 with an electronic device placed on the mounting platform, but not secured by the resilient mounting flanges.
Figure 4:
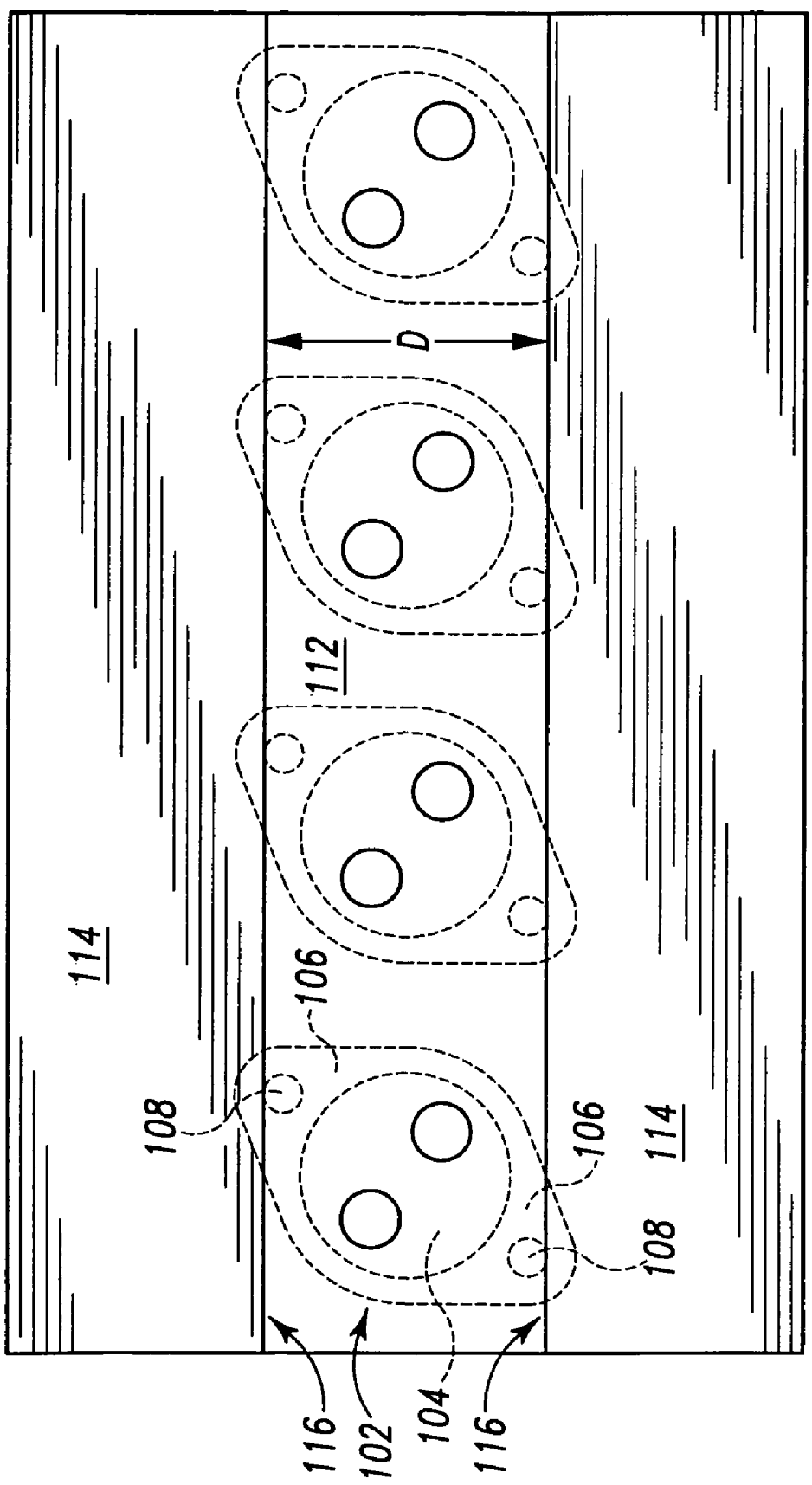
FIG. 4 is a top plan view of the heat sink of FIG. 1, but with multiple electronic devices secured in place.
Figure 5:
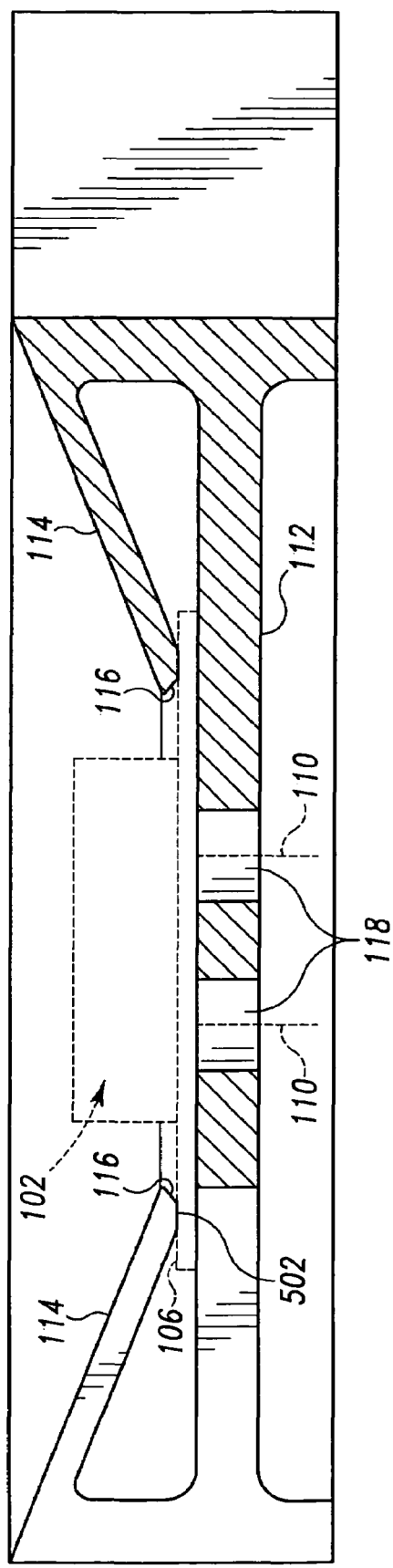
FIG. 5 is a side cross sectional view of the heat sink of FIG. 2 along line 5-5.

FIGS. 3-5 show that the clamping portion 116 of the resilient mounting flanges 114 may be spaced apart a distance "D". The distance "D" may be a range of distances that allows the electronic device 102 to be placed on the mounting platform 112 and rotated such that the tabs 106 of the electronic device 102 engage the clamping portion 116 of the resilient mounting flanges 114. As shown in FIG. 3, for example, the distance "D" is sufficiently sized such that the electronic device 102 may be oriented to a position between the resilient mounting flanges 114. With this orientation, the electronic device 102 may be placed on the mounting platform 112 without obstruction from the resilient mounting flanges 114. However, the distance "D" is also sufficiently sized such that rotation of the electronic device results in the engagement of the tabs with the clamping portion of the resilient mounting flanges as shown in FIGS. 4 and 5. It should be appreciated that the distance "D" may depend on the size of electronic devices to be mounted on the heat sink 100.

The amount of space between the clamping portion 116 of the resilient mounting flanges 114 and the mounting platform 112 is preferably less than the thickness of the tabs 106 so that the tabs 106 deflect the resilient mounting flanges 114 away from the mounting platform 112. When the tabs 106 deflect the resilient mounting flanges 114, the resilient mounting flanges 114 are configured to apply a sufficient clamping force on the tabs 106 to prevent lateral movement of the electronic device 102. In some examples, the clamping force may be similar to that of an external fastener, such as a screw or rivot. The clamping portion 116 of the resilient mounting flange 114 may have a chamfered surface 502 to ease rotation of the electronic device (as most easily seen in FIG. 5).

In some examples, the resilient mounting flanges 114 may be configured such that the deflection from the tabs 106 does not permanently deform the resilient mounting flanges 114. It should be appreciated, for example, that the resilient mounting flanges 114 may be configured such that the stress from the deflection is below the yield strength of the material from which the resilient mounting flanges 114 are formed. For example, the resilient mounting flanges 114 may be designed in the elastic region of the stress-strain curve of the material to ensure strong and consistent clamping force on the tabs 106 of the electronic device 102.

Figure 6:
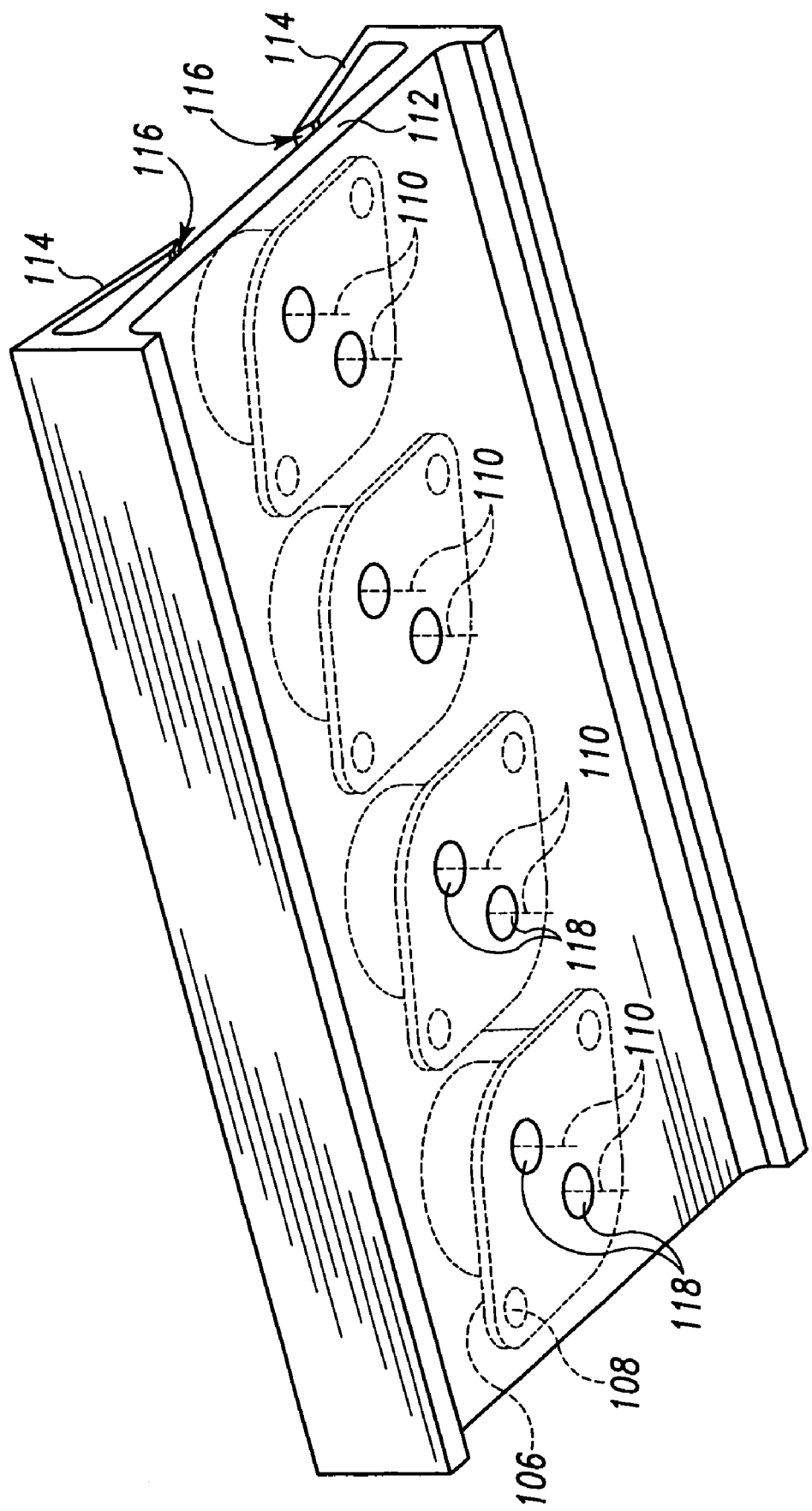
FIG. 6 is a bottom perspective view of the heat sink of FIG. 2.

The heat sink 100 may be configured to hold a single electronic device or multiple electronic devices. The heat sink 100 is shown in FIGS. 4 and 6 with four electronic devices 102 for example purposes only. It should be appreciated that the length of the heat sink 100 and arrangement of pin openings 118 could be adapted allow the heat sink to hold various numbers and configurations of electronic devices 102.

Figure 7:
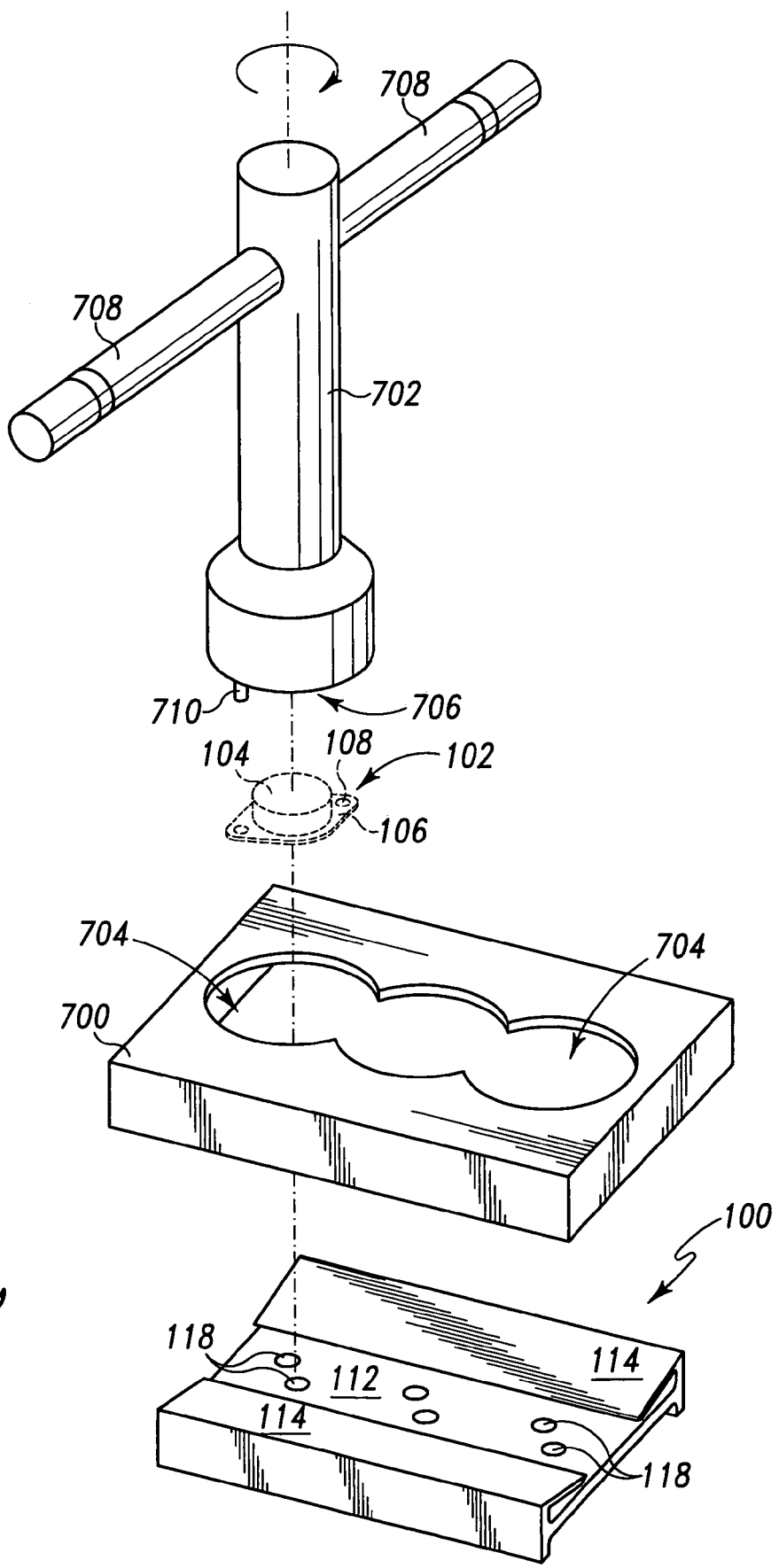
FIG. 7 is an exploded view of a mechanism that may be used to manually mount electronic devices on the heat sink.
Figure 8:
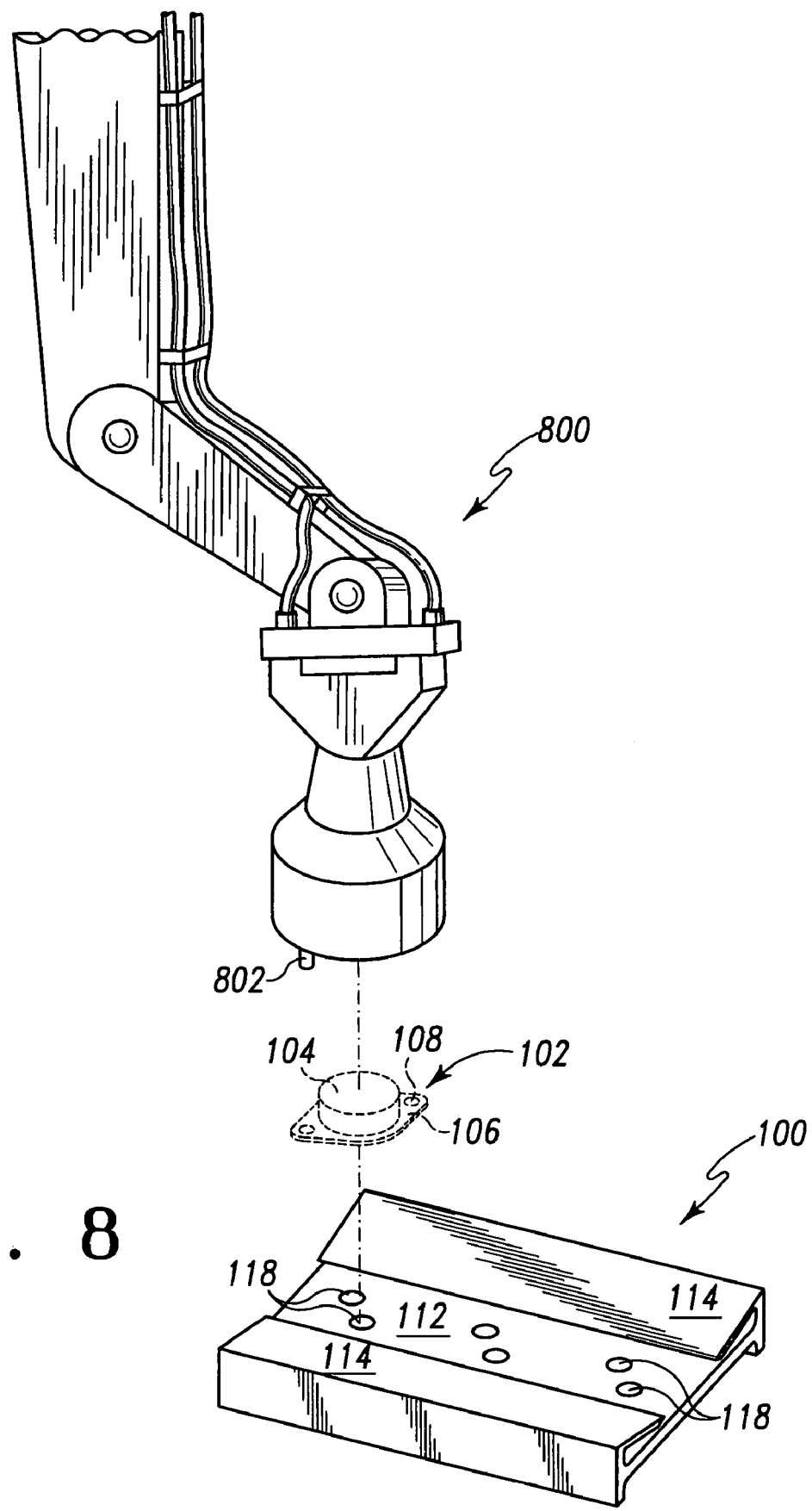
FIG. 8 is an exploded view of a mechanism that may be used to automatically mount electronic devices on the heat sink.

The electronic device 102 may be installed in the heat sink 100 manually (FIG. 7) or through an automated process (FIG. 8). In examples in which the electronic device is installed manually, an alignment guide 700 and wrench 702 may be used. For example, the alignment guide 700 may have apertures 704 dimensioned to receive the distal end of 706 the wrench 704. By placing the wrench 702 in an aperture 704, the leads 106 of the electronic device 102 may be easily aligned with the pin openings 118 in the mounting platform 112. The wrench 702 may have handles 708 to facilitate rotation of the electronic device 102. In some examples, the wrench 702 may contain projections 710 to engage openings 108 in the tabs 106 of the electronic device 102 to aid in the rotation of the electronic device.

In other examples, an automated process, such as a robotic arm 800, may be used to install the electronic device 102 on the heat sink 100. The robotic arm 800 may be configured to position the electronic device 102 on the mounting platform 100 and rotate the electronic device 102 such that the tabs 106 are secured by the resilient mounting flanges. If multiple electronic devices 102 are to be installed on the heat sink, the robotic arm 800 may be configured to successively install the electronic devices on the heat sink. In some examples, the robotic arm 800 may have projections 802 for engaging the openings in the tabs. In other examples, the robotic arm may engage the body 104 of the electronic device. The robotic arm 800 is shown for purposes of example only. It should be appreciated that other automated processes could be used to mount electronic devices 102 on the heat sink 100.

In operation, an electronic device 102 is positioned above the mounting platform such that the lead(s) in the electronic device are aligned with the pin opening(s) in the mounting platform. The base of the electronic device 102 may be then placed on the mounting platform such that the lead(s) of the electronic device 102 pass through the mounting platform 112. Next, the electronic device 102 may be rotated such that the tabs 106 of the electronic device 102 deflect the resilient mounting flanges 114. A portion of the tab 100 will then be secured in a frictional fit between the resilient mounting flanges 114 and the mounting platform 112. As discussed above, mounting of electronic device 102 on the heat sink 100 may be accomplished either manually or through an automated process.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A heat sink for an electronic device, the heat sink comprising:
    a mounting platform having a first side and an opposing second side, the mounting platform defining a mounting plane;
    a first resilient mounting flange extending from the first side of the mounting platform; and
    a second resilient mounting flange extending from the second side of the mounting platform,
    where the first resilient mounting flange is spaced apart from the second resilient mounting flange such that rotation of an electronic device in a plane substantially parallel with the mounting plane causes at least a portion of the electronic device to be secured in a frictional fit between the mounting platform and at least one of either the first resilient mounting flange or the second resilient mounting flange.

2. The heat sink as recited in claim 1, where the electronic device includes a first tab and a second tab, where the first tab is secured between the first resilient mounting flange and the mounting platform upon rotation of the electronic device in a plane substantially parallel with the mounting plane.

3. The heat sink as recited in claim 2, where the second tab is secured between the second resilient mounting flange and the mounting platform upon rotation of the electronic device in a plane substantially parallel with the mounting plane.

4. The heat sink as recited in claim 1, further comprising a pin opening defined in the mounting platform, the pin opening dimensioned to receive at least one lead extending from the electronic device.

5. The heat sink of claim 1, where the first resilient mounting flange is substantially parallel with respect to the second resilient mounting flange.

6. The heat sink of claim 5, where the mounting platform includes a longitudinal axis, the first resilient mounting flange and the second resilient mounting flange being substantially parallel with respect to the longitudinal axis.

7. The heat sink of claim 1, where the first resilient mounting flange and the second resilient mounting flange are formed as a single piece with the mounting platform.

8. A heat sink for an electronic device with a first tab and a second tab, the heat sink comprising: a mounting platform formed to define a pin opening dimensioned to receive at least one lead extending from an electronic device, the mounting platform having a first side and an opposing second side; a first resilient mounting flange extending from the first side of the mounting platform and including a first clamping portion suspended above the mounting platform, the first clamping portion spaced apart from the mounting platform such that engagement of a first tab included on the electronic device with the first resilient mounting flange secures the first tab in a frictional fit between the first clamping portion and the mounting platform; and a second resilient mounting flange extending from the second side of the mounting platform and including a second clamping portion suspended above the mounting platform, the second clamping portion spaced apart from the mounting platform such that engagement of a second tab included on the electronic device with the second resilient mounting flange secures the second tab in a frictional fit between the second clamping portion and the mounting platform.

9. The heat sink of claim 8, where the first resilient mounting flange is substantially parallel with respect to the second resilient mounting flange.

10. The heat sink of claim 9, where the mounting platform includes a longitudinal axis, the first resilient mounting flange and the second resilient mounting flange being substantially parallel with respect to the longitudinal axis.

11. The heat sink of claim 8, where the first resilient mounting flange and the second resilient mounting flange are formed with the mounting platform as a single piece.

12. The heat sink of claim 8, where the first clamping portion and the second clamping portion are spaced apart a distance that allows the electronic device to be placed on the mounting platform without obstruction from either the first resilient mounting flange or the second resilient mounting flange.

13. The heat sink of claim 12, where the pin openings have a shape selected from the group consisting of a circle, a oval, a square, a rectangle and an arc.

14. The heat sink of claim 8, where the mounting platform includes less pin openings than the number of leads extending from the electronic device.

15. The heat sink of claim 8, where the mounting platform includes more pin openings than the number of leads extending from the electronic device.

16. The heat sink of claim 8, where an internal surface of the pin opening is lined with an electronically insulating material.

17. The heat sink of claim 8, where the first resilient mounting flange and the second resilient mounting flange are configured such that a stress from the deflection with the first tab and the second tab of the electronic device is less than a yield strength of the material from which the first resilient mounting flange and the second resilient mounting flange are formed.

18. The heat sink of claim 8, where the mounting platform, the first resilient mounting flange and the second resilient mounting flange are adapted to carry multiple electronic devices.

19. A heat sink for an electronic device with a first tab and a second tab, the heat sink comprising: a mounting platform formed to define a pin opening dimensioned to receive at least one lead extending from an electronic device, the mounting platform adapted to support the electronic device such that at least a portion of the electronic device is in thermal contact with the mounting platform and the at least one lead passes through the pin opening; a first resilient mounting flange formed with the mounting platform and including a first clamping portion suspended over the mounting platform; and a second resilient mounting flange formed with the mounting platform and including a second clamping portion suspended over the mounting platform, where the first resilient mounting flange and the second resilient mounting flange are formed with the mounting platform as a single piece; where the first resilient mounting flange is adapted to secure a first tab included on the electronic device in a frictional fit between the clamping portion of the first resilient mounting flange and the mounting platform, and where the second resilient mounting flange is adapted to secure a second tab included on the electronic device in a frictional fit between the clamping portion of the second resilient mounting flange and the mounting platform.

20. The heat sink of claim 19, where the first clamping portion and the second clamping portion are spaced apart such that the electronic device may be placed on the mounting platform without obstruction from either the first resilient mounting flange or the second resilient mounting flange.

21. The heat sink of claim 19, where the first resilient mounting flange is substantially parallel with respect to the second resilient mounting flange.

22. The heat sink of claim 21, where the mounting platform includes a longitudinal axis, the first resilient mounting flange and the second resilient mounting flange being substantially parallel with respect to the longitudinal axis.

23. The heat sink of claim 22, where the pin opening defines a transverse axis, the transverse axis being substantially perpendicular with respect to the longitudinal axis.

24. The heat sink of claim 19, further comprising a gap filler disposed between the electronic device and the mounting platform.

25. A heat sink for an electronic device, the heat sink comprising: a mounting platform formed to define a pin opening dimensioned to receive at least one lead extending from an electronic device, the mounting platform adapted to support the electronic device such that a portion of the electronic device is in thermal contact with the mounting platform and the at least one lead passes through the pin opening; and spring means formed on the mounting platform for securing at least one tab included on and extending from the electronic device to the mounting platform.

26. The heat sink of claim 25, where the spring means is configured to secure the at least one tab when the electronic device is rotated on the mounting platform.

27. A heat sink for an electronic device, the heat sink comprising:
 a mounting platform formed to define a pin opening dimensioned to receive at least one lead extending from an electronic device, the mounting platform adapted to support the electronic device such that a portion of the electronic device is in thermal contact with the mounting platform and the at least one lead passes through the pin opening; and
 spring means formed on the mounting platform for securing at least one tab extending from the electronic device to the mounting platform;
 where the spring means is configured to secure the at least one tab when the electronic device is rotated on the mounting platform; and
 where the pin opening is dimensioned to allow unimpeded movement of the at least one lead of the electronic device during rotation of the electronic device.

28. A heat sink for an electronic device, the heat sink comprising:
 a mounting platform adapted to support the electronic device such that at least a portion of the electronic device is in thermal contact with the mounting platform;
 a pair of opposing resilient mounting flanges formed as a single piece with the mounting platform,
 where the pair of opposing resilient mounting flanges are spaced apart such that the electronic device can be placed on the mounting platform without obstruction from the pair of resilient mounting flanges, and
 where the pair of resilient mounting flanges are spaced apart such that rotation of the electronic device on the mounting platform secures at least a portion of the electronic device in a frictional fit between the pair of resilient mounting flanges and the mounting platform.

29. The heat sink of claim 28, where the pair of opposing resilient mounting flanges are substantially parallel with respect to each other.

30. The heat sink of claim 29, where the mounting platform includes a longitudinal axis, the pair of opposing resilient mounting flanges being substantially parallel with respect to the longitudinal axis.

31. The heat sink of claim 28, where the mounting platform and the pair of opposing resilient mounting flanges are formed from materials selected from the group consisting of copper, aluminum and steel.

32. The heat sink of claim 28, where the mounting platform and the pair of opposing resilient mounting flanges are formed from different materials.

33. The heat sink of claim 28, where the pair of opposing resilient mounting flanges are configured such that a stress from the frictional fit with the electronic device is less than a yield strength of the material from which the pair of opposing resilient mounting flanges are formed.

34. A heat sink for an electronic device, the heat sink comprising:
 a mounting platform formed to define a first pin opening dimensioned to receive at least one lead extending from a first electronic device and a second pin opening dimensioned to receive at least one lead extending from a second electronic device, the mounting platform adapted to support the first electronic device such that at least a portion of the first electronic device is in thermal contact with the mounting platform and the at least one lead of the first electronic device passes through the first pin opening, the mounting platform adapted to carry the second electronic device such that at least a portion of the second electronic device is in thermal contact with the mounting platform and the at least one lead of the second electronic device passes through the second pin opening; and
 a pair of opposing resilient mounting flanges integrally formed with the mounting platform,
 where the pair of opposing resilient mounting flanges are spaced apart such that the first electronic device and the second electronic device can be placed on the mounting platform without obstruction from the pair of resilient mounting flanges,
 where the pair of resilient mounting flanges are spaced apart such that rotation of the first electronic device on the mounting platform secures at least a portion of the first electronic device in a frictional fit between the pair of resilient mounting flanges and the mounting platform, and
 where the pair of resilient mounting flanges are spaced apart such that rotation of the second electronic device on the mounting platform secures at least a portion of the second electronic device in a frictional fit between the pair of resilient mounting flanges and the mounting platform.

35. A method of mounting an electronic device on a heat sink, the method comprising the steps of:
 providing a heat sink including a mounting platform and a pair of opposing resilient mounting flanges, the mounting platform defining a mounting plane;
 aligning an electronic device between the pair of opposing resilient mounting flanges of the heat sink;
 placing the electronic device on the mounting platform of the heat sink; and
 rotating the electronic device in a plane substantially parallel with the mounting plane until at least a portion of the electronic device is secured in a frictional fit between at least one of the pair of resilient mounting flanges and the mounting platform.

36. The method of claim 35, where the electronic device includes a first tab and a second tab and where the first tab and the second tab are secured by the pair of resilient mounting flanges during the rotating step.

37. The method of claim 36, where the electronic device includes openings in the first tab and the second tab and in the rotating step the openings are engaged to rotate the electronic device.

38. A method of mounting an electronic device on a heat sink, the method comprising the steps of:
 providing a heat sink including a mounting platform with a pin opening and a pair of opposing resilient mounting flanges;
 placing an electronic device on the mounting platform of the heat sink such that at least one lead of the electronic device passes through the pin opening in the mounting platform of the heat sink; and
 rotating the electronic device until a portion of the electronic device is secured by the pair of resilient mounting flanges.

39. A heat sink for an electronic device, the heat sink comprising:
 a mounting platform formed to define a pin opening dimensioned to receive at least one lead that extends from an electronic device, the mounting platform adapted to support the electronic device such that a portion of the electronic device is in thermal contact with the mounting platform and the at least one lead passes through the pin opening, where the pin opening is dimensioned to avoid contact between the mounting platform and the at least one lead of the electronic device, where the electronic device is rotatable on the mounting platform to secure the electronic device; and a spring configured on the mounting platform to secure at least one tab of the electronic device.

* * * * *